US006605547B1

(12) United States Patent
Yang

(10) Patent No.: US 6,605,547 B1
(45) Date of Patent: Aug. 12, 2003

(54) ELECTRICAL STANDOFF HAVING A TRANSMISSION STRUCTURE AND METHOD OF MANUFACTURE

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/155,200

(22) Filed: May 23, 2002

(51) Int. Cl.[7] .............................................. H01L 21/302
(52) U.S. Cl. ..................... 438/733; 438/734; 244/118.1
(58) Field of Search ........................ 244/118.1; 438/733, 438/734

(56) References Cited

U.S. PATENT DOCUMENTS 6,257,522 B1 * 7/2001 Friend et al. ............ 244/118.1

* cited by examiner

*Primary Examiner*—David Nelms
*Assistant Examiner*—Mai-Huong Tran
(74) *Attorney, Agent, or Firm*—William K. Bucher

(57) ABSTRACT

An electrical standoff has a dielectric substrate with opposing horizontal surfaces and at least two opposing vertical end walls. A transmission structure having planar elements is formed on the at least one of the horizontal surfaces with the planar elements of the transmission structure extending to the two opposing vertical end walls. The electrical standoff is formed from a wafer of dielectric material having at least a first transmission structure formed thereon. A low temperature water soluble wax is applied over the transmission structure and a protective covering is placed over the water soluble wax. The wafer is sawn to form the electrical standoff with the electrical standoff having two opposing sawn vertical end walls intersecting the planar elements of the transmission structure. The protective covering and the low temperature water soluble wax are removed from the electrical standoff.

7 Claims, 3 Drawing Sheets

ELECTRICAL STANDOFF HAVING A TRANSMISSION STRUCTURE AND METHOD OF MANUFACTURE

BACKGROUND OF THE INVENTION

The present invention related generally to electrical standoffs and more particularly to electrical standoffs having a transmission structure formed thereon for coupling extremely high frequency electrical signals.

Transmission structure electrical standoffs are used as transition devices between semiconductor devices having transmission structures. A semiconductor dies, for example, may have coplanar transmission structures formed on one of the horizontal surfaces of the dies. The transmission structure electrical standoff has a coplanar transmission structure that dimensionally and electrically matches the coplanar transmission structure on the semiconductor die. The transmission structure electrical standoff is butted against the semiconductor die with the ends of the coplanar transmission structures of the electrical standoff and the semiconductor die aligned and coplanar. The coplanar transmission structures on the electrical standoff and the semiconductor die are electrically coupled using electrical conductors, such as conductive wires or gold foil. Excessive probing or wire or wedge bonding to the transmission structure on the semiconductor die will remove portions of the gold layer destroying the electrical connectivity of the transmission structure. The transmission structure electrical standoff allows probing of the output of the semiconductor die without contacting the coplanar transmission structure on the die.

The traditional method of manufacturing transmission structure electrical standoffs is to lay down multiple gold transmission structures using a thin or thick film process on a wafer of dielectric material, aluminum oxide or the like. The wafer of dielectric material is then laser scribed and the individual electrical standoffs are snapped off from the wafer. The resulting electrical standoffs has vertically jagged end walls due to the snapping off process. Further, the laser scribing is performed away from the coplanar transmission structure due to the heat generated in the scribing process that would lift the gold layers of the coplanar transmission structure away from the substrate.

The resulting electrical standoff has drawbacks when used in extremely high frequency electrical signal applications. The combination of the jagged vertical end walls and the placement of the ends of the coplanar transmission structure away from the vertical end walls requires longer electrical connectors between the coplanar transmission structures. The longer electrical connectors and the air gap between the electrical standoff and the semiconductor die due to the jagged vertical end wall contribute to limit the bandwidth of the coplanar transmission line connection between the electrical standoff and the semiconductor die.

What is needed is a electrical standoff that overcomes the bandwidth limitations of the currently use electrical standoffs. The electrical standoff needs to have vertical end walls that can be butted flush with a semiconductor die. The electrical standoff should also have a transmission structure that extends to the vertical end walls of the standoff. Further, a manufacturing process is needed that produces an electrical standoff that has at least two perpendicular end walls with a coplanar transmission structure that extends to the perpendicular end walls.

SUMMARY OF THE INVENTION

Accordingly, the present invention is to an electrical standoff usable for coupling extremely high frequency electrical signals over a transmission structure. The electrical standoff has a dielectric substrate with opposing horizontal surfaces and at least two opposing vertical end walls. A transmission structure having planar elements is formed on the at least one of the horizontal surfaces with the planar elements of the transmission structure extending to the two opposing vertical end walls. In the preferred embodiment, the transmission structure is a coplanar transmission structure formed on one of the horizontal surfaces of the dielectric substrate.

The electrical standoff is manufactured by forming at least a first transmission structure having planar elements on a wafer of dielectric material. A low temperature water soluble wax is applied over the transmission structure on the wafer of dielectric material and a protective covering is applied over the water soluble wax. A coolant is directed onto the wafer of dielectric material and the wafer of dielectric material is sawn to form the electrical standoff. Two of the opposing sawn vertical end walls intersect the planar elements of the transmission structure. The protective covering and low temperature water soluble wax are removed from the electrical standoff.

In the preferred embodiment, a plurality of transmission structures are formed on the wafer of dielectric material. The transmission structures formed on the wafer of dielectric material may be a coplanar transmission structure, a stripline transmission structure, or similar transmission structures. The protective covering may be an adhesive tape. The coolant may take the form of a water jet, refrigerated air or the like that is directed onto the wafer of dielectric material. After the wafer is sawn to form the electrical standoffs, the adhesive tape and the water soluble wax is removed from the electrical standoff.

The objects, advantages and novel features of the present invention are apparent from the following detailed description when read in conjunction with appended claims and attached drawings.

DETAILED DESCRIPTION OF THE PREFERRED EMBODIMENT

Figure 1:
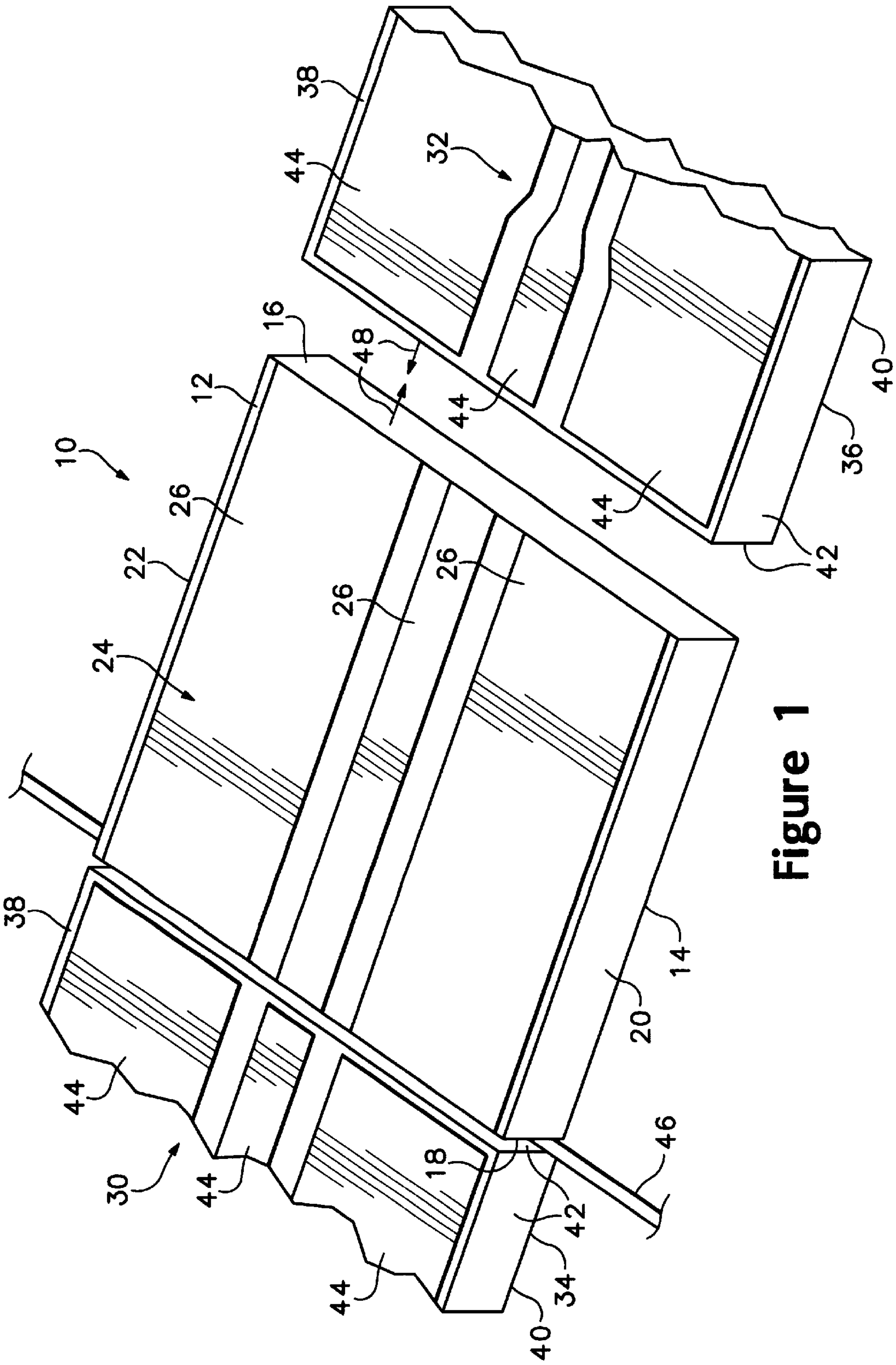
FIG. 1 is a perspective view of a first embodiment of the electrical standoff having a transmission structure according to the present invention.

Referring to FIG. 1, there is shown an electrical standoff 10 according to the present invention. The standoff 10 has opposing horizontal surfaces 12 and 14 and opposing parallel vertical end walls 16 and 18. In the present invention, the vertical end walls 16 and 18 are defined as being a wall having a vertical end face perpendicular to the horizontal surfaces without the jagged face produced by the snapped off laser scribed vertical end walls of the prior art. Two additional opposing parallel sidewalls 20 and 22 run perpendicular to the vertical end walls 16 and 18. The opposing sidewalls 20 and 22 may be formed using the laser scribing snap off process of the prior art. The electrical standoff is preferably formed of a dielectric material, such as aluminum oxide or the like. FIG. 1 illustrates a coplanar transmission structure 24 formed on one of the horizontal surfaces 12 of the standoff. The coplanar transmission structure 24 has coplanar elements 26 extending between and intersecting the opposing vertical end walls 16 and 18. The patterned coplanar transmission elements 26 are formed of thin layers of gold over an adhesion material, such as titanium and/or platinum plating using standard thin film processes. The length of the electrical standoff 10 parallel to the coplanar elements 26 of the coplanar transmission structure 23 is 400 microns. Alternatively, the coplanar elements may be formed using standard thick film processes.

The electrical standoff 10 is preferably used as a transition between transmission structures 30 and 32 formed on semiconductor dies 34 and 36, such as a gallium arsenide sampling diodes , an optical-to-electrical converting photodiode or the like. The semiconductor dies 34 and 36 have opposing horizontal surfaces 38 and 40 and side surfaces 42. The patterned coplanar elements 44 of the transmission structures 30 and 32 on the semiconductor dies 34 and 36 are formed of thin layers of gold. One end of the coplanar elements 44 is adjacent to one of the end surfaces 42 of the dies 34 and 36. One use of the electrical standoff 10 is in an opto-electrical assembly where the semiconductor photodiode is positioned on one movable element and is electrically coupled to a semiconductor sampling diode positioned on another movable element as represented by the gap 46 between the electrical standoff 10 and the semiconductor die 34. The electrical standoff 10 is positioned in an abutting relationship with the semiconductor die 36 with one of the vertical end walls 16 and 18 abutting the end face 42 of the die 36 as represented by the arrows 48. Electrical conductors (not shown) electrically couple the coplanar transmission structure 32 of the semiconductor die 36 to the coplanar transmission structure 24 of the electrical standoff 10. The movable elements of the opto-electrical assembly are positioned to align the coplanar transmission structure 30 on the semiconductor die 34 with the coplanar transmission structure 24 on the electrical standoff 10. The moveable elements are mechanically joined together and electrical conductors (not shown) electrical coupled the coplanar transmission structures 24 and 30 together. Alternatively, the electrical standoff 10 may abut the semiconductor 34 instead of semiconductor die 36. Further each of the semiconductor dies 34 and 36 may have an abutting electrical standoff 10. The electrical standoffs 10 are then joined across the gap between the two movable elements of the opto-electrical assembly.

Figure 2:
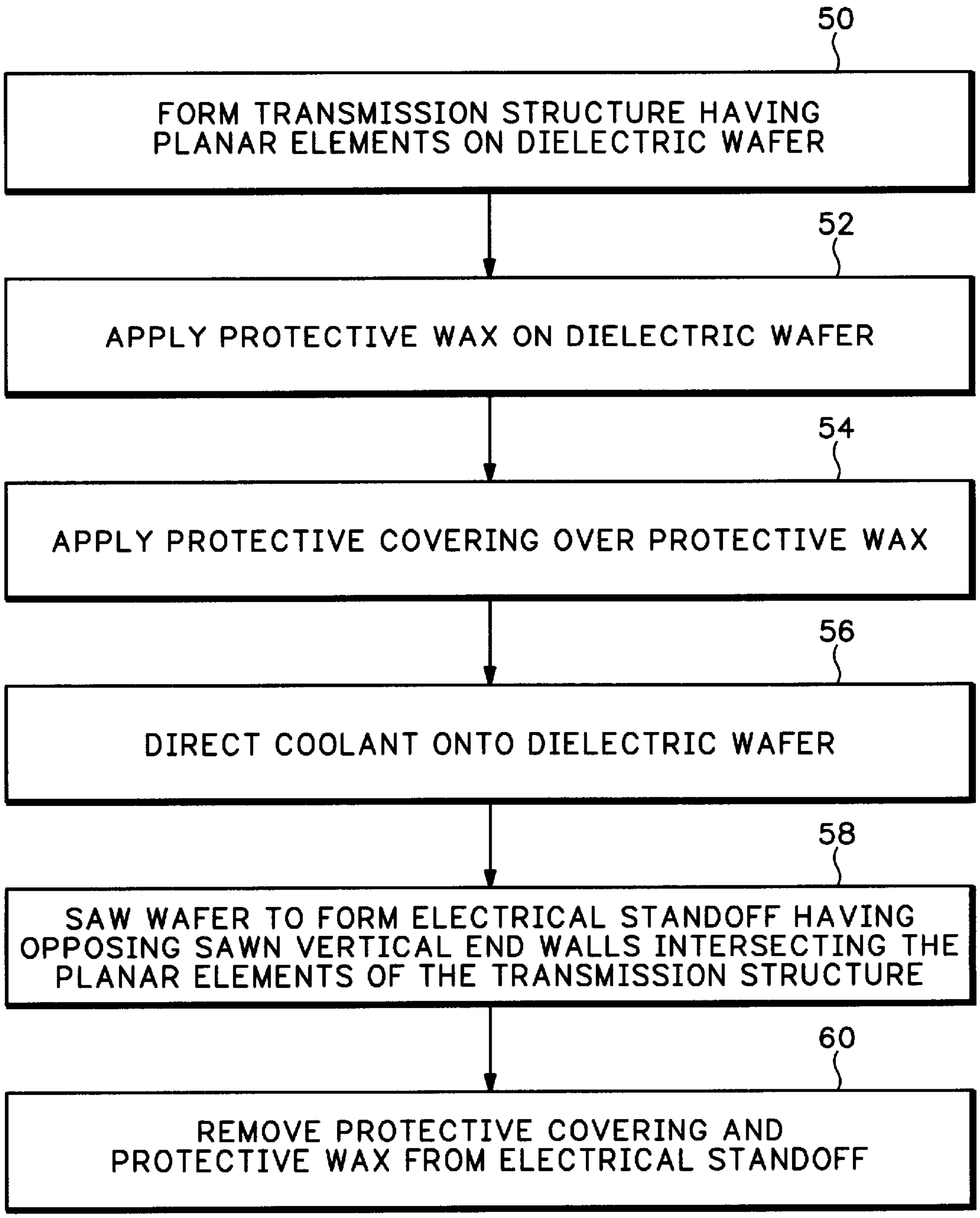
FIG. 2 is a flow chart illustrated the manufacturing steps in making the electrical standoff having a transmission structure according to the present invention.

The flow chart of FIG. 2 illustrates the steps in forming the electrical standoff 10 according to the present invention. At least one and preferably multiple transmission structures 24 are formed on a wafer of dielectric material as represented by step 50. The transmission structures 24 may be coplanar transmission structures, stripline transmission structures or the like. Each transmission element 26 of the transmission structures 24 is formed of a thin layer of gold using well known thin and thick film processes. In the preferred embodiment, a thin film process is used to form the transmission elements 26 of the transmission structures 24. Laser scribing may be used to scribe snap lines in the wafer of dielectric material to position the locations of the sidewalls 20 and 22. A protective coating is applied over the wafer of dielectric material to prevent the gold transmission structures 24 from lifting off of the wafer of dielectric material during the formation of the electrical standoffs 10 as represented by step 52. In the preferred embodiment, the protective coating is a low temperature water soluble wax, such as Crystal Bond or the like. An adhesive tape is placed over the wax to prevent the wax from being removed during processing and to prevent the electrical standoffs 10 from being lost during processing as represented by step 54. A coolant is applied to the wafer to prevent heat buildup in the wafer during the subsequent sawing process as represented by step 56. Preferably, the coolant is a jet of water applied to wafer where the saw blade is cutting. Alternately, refrigerated air or other types of coolant may be used so long as the coolant removes the frictional heat of sawing precess from the wafer of dielectric material. The wafer of dielectric material is then sawn using a saw blade on a line that is perpendicular to and intersects the coplanar elements 26 of the transmission structures 24 as represented by step 58. After the vertical end walls 16 and 18 are cut, the sidewalls 20 and 22 are formed by snapping the sawn wafer parts at the laser scribe lines. The sidewalls 20 and 22 may also be formed by sawing the sidewalls using the same process as the vertical end walls 16 and 18. The adhesive tape is then removed from the electrical standoffs 10 and the water soluble wax is washed off the electrical standoffs 10 as represented by step 60.

Figure 3:
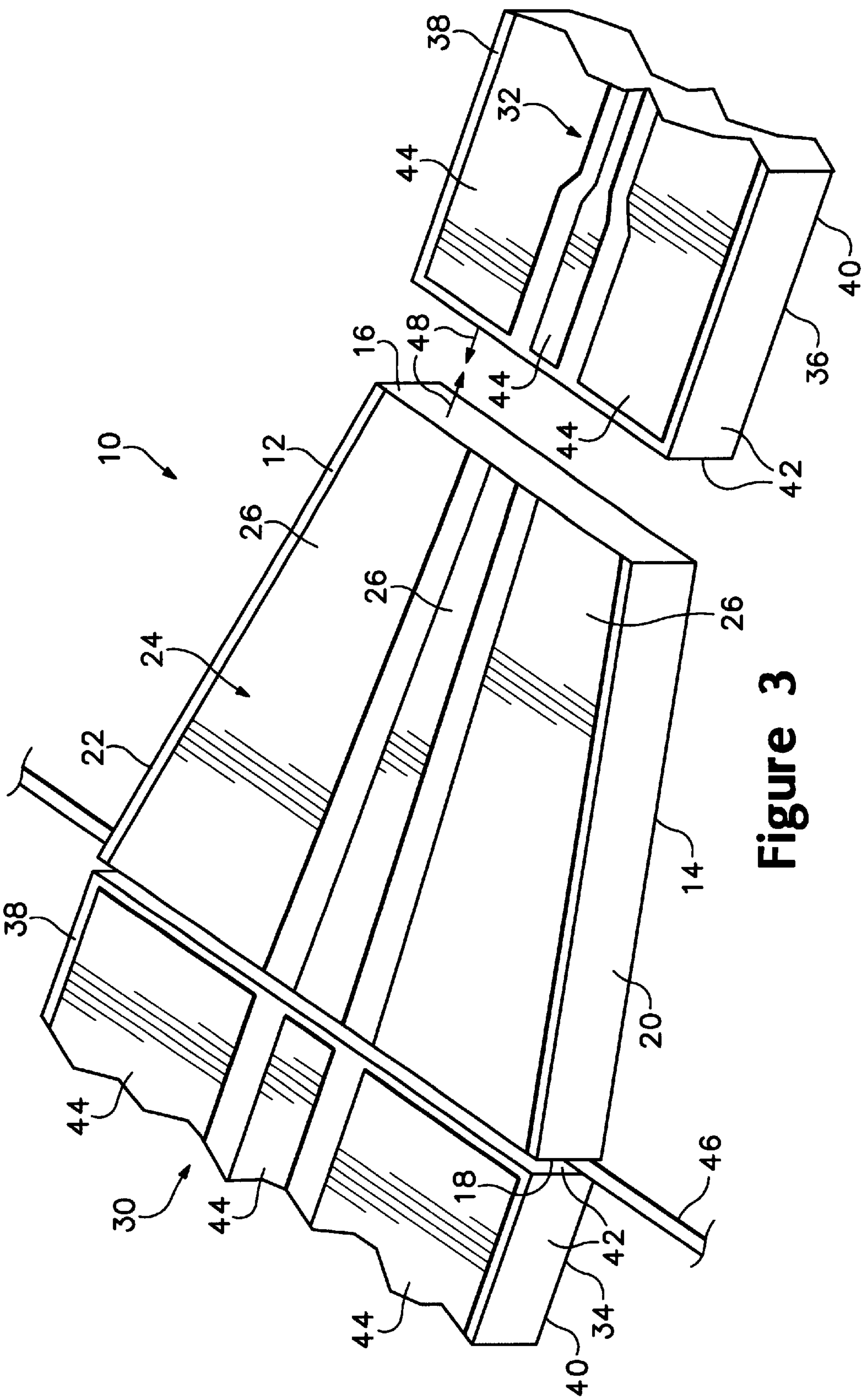
FIG. 3 is a perspective view of another embodiment of the electrical standoff having a transmission structure according to the present invention.

Referring to FIG. 3, there is illustrated an alternative electrical standoff 10 usable with semiconductor dies 34 and 36 having dimensionally different transmission structures 30 and 32. Due to different types of semiconductor materials, the coplanar transmission structure 30 on one die 34 may be dimensionally different from the coplanar transmission structure 32 on the other semiconductor die 36 to maintain the characteristic impedance between the transmission structures 30 and 32. This results in semiconductor dies having different widths. The electrical standoff 10 is formed of the same dielectric material as previously described. The width of each of the parallel vertical end walls 16 and 18 match the width of semiconductor die 34 and 36. The vertical end walls 16 and 18 are formed using the previously described process. The sidewalls 20 and 22 are angled between the parallel vertical end walls 16 and 18 forming a trapezoidal shaped electrical standoff. The planar elements 26 of the coplanar transmission structure 24 on the electrical standoff 10 are formed using thin or thick film processes and dimensionally transition from the coplanar transmission structure 32 on one die 36 to the coplanar transmission structure 30 on the other die 34.

An electrical standoff has been described having a dielectric substrate with opposing horizontal surfaces and two opposing parallel vertical end walls. A transmission structure having planar elements is formed on the at least one of the horizontal surfaces with the planar elements of the transmission structure extending to the two opposing vertical end walls. The electrical standoff is formed from a wafer of dielectric material having at least a first transmission structure formed thereon. A low temperature water soluble wax is applied over the transmission structure and a protective covering is placed over the water soluble wax. The wafer is sawn to form the electrical standoff with the sawn opposing parallel vertical end walls intersecting the planar elements of the transmission structure. The protective covering and the low temperature water soluble wax are removed from the electrical standoff.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of manufacturing an electrical standoff comprising:

forming at least a first transmission structure having planar elements on a wafer of dielectric material;

applying a low temperature water soluble wax over the transmission structure on the wafer of dielectric material;

applying a protective covering over the water soluble wax;

directing a coolant onto the wafer of dielectric material and sawing the wafer of dielectric material to form the electrical standoff with the electrical standoff having two opposing sawn vertical end walls intersecting the planar elements of the transmission structure; and removing the protective covering and low temperature water soluble wax from the electrical standoff.

2. The method of manufacturing an electrical standoff as recited in claim 1 wherein the transmission structure forming step further comprises the step of forming a coplanar transmission structure on the wafer of dielectric material.

3. The method of manufacturing an electrical standoff as recited in claim 1 wherein the transmission structure forming step further comprises the step of forming a plurality of transmission structures on the wafer of dielectric material.

4. The method of manufacturing an electrical standoff as recited in claim 1 wherein applying the protective covering step comprises applying an adhesive tape over the water soluble wax.

5. The method of manufacturing an electrical standoff as recited in claim 4 wherein the protective covering removing step further comprises the steps of:

removing the adhesive tape from the electrical standoff; and removing the water soluble wax from the electrical standoff with water.

6. The method of manufacturing an electrical standoff as recited in claim 1 wherein the coolant directing step comprises directing a water jet onto the wafer of dielectric material.

7. The method of manufacturing an electrical standoff as recited in claim 1 wherein the coolant directing step comprises directing refrigerated air onto the wafer of dielectric material.

* * * * *